(12) United States Patent
Abe et al.

(10) Patent No.: US 9,247,193 B2
(45) Date of Patent: Jan. 26, 2016

(54) TRANSFERRING MULTIPLE RECORDS INCLUDING VIDEO DATA

(71) Applicant: International Business Machines Corporation, Armonk, NY (US)

(72) Inventors: Atsushi Abe, Tokyo (JP); Setsuko Masuda, Tokyo (JP); Yumiko Ohta, Tokyo (JP); Terue Watanabe, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 14/307,363

(22) Filed: Jun. 17, 2014

(65) Prior Publication Data

US 2015/0037010 A1     Feb. 5, 2015

(30) Foreign Application Priority Data

Jul. 30, 2013   (JP) ................................ 2013-158349

(51) Int. Cl.
| | |
|---|---|
| H04N 5/94 | (2006.01) |
| H04N 5/7824 | (2006.01) |
| H03M 13/00 | (2006.01) |
| G11B 5/09 | (2006.01) |
| H04N 5/783 | (2006.01) |
| H04N 9/87 | (2006.01) |
| H04N 9/79 | (2006.01) |

(52) U.S. Cl.
CPC ............. *H04N 5/783* (2013.01); *H04N 9/7921* (2013.01); *H04N 9/87* (2013.01)

(58) Field of Classification Search
CPC ....... H04N 5/94; H04N 5/7824; H03M 13/00; G11B 5/09
USPC .......... 386/263; 360/32, 48, 53; 714/752, 755
See application file for complete search history.

(56) References Cited

U.S. PATENT DOCUMENTS

| | | | |
|---|---|---|---|
| 5,359,468 A * | 10/1994 | Rhodes ................... | G11B 20/10 360/32 |
| 2003/0066013 A1* | 4/2003 | Maple ................ | G11B 20/1833 714/771 |
| 2005/0204267 A1* | 9/2005 | Nakagawa ......... | G11B 20/1258 714/770 |
| 2008/0320361 A1* | 12/2008 | Fukuda .............. | G11B 20/1833 714/755 |

FOREIGN PATENT DOCUMENTS

JP            2010225196       10/2010

* cited by examiner

*Primary Examiner* — Geepy Pe
*Assistant Examiner* — Syed Hasan
(74) *Attorney, Agent, or Firm* — Zilka-Kotab, PC

(57) ABSTRACT

In one embodiment, a method includes receiving from the host a video special mode for reading video data, and sequentially reading the records included in data sets from the tape medium into segments of a buffer. When there is a C2 error during reading of the data sets, a predetermined error recovery process is skipped in accordance with the video special mode. When management information (DSIT) for the data set having the C2 error is available for reading, sending of the record(s) included in the data set having the C2 error to the host is skipped. For the data set having the C2 error, the number of records to be skipped included in the data set having the C2 error based on and from the DSIT is obtained and indicated to the host.

20 Claims, 11 Drawing Sheets

C2 CODE CORRECTION ERROR IN TAPE DRIVE

TRANSFERRING MULTIPLE RECORDS INCLUDING VIDEO DATA

RELATED APPLICATION

This application claims priority to Japanese Patent Application No. 2013-158349, filed Jul. 30, 2013, which is herein incorporated by reference.

BACKGROUND

The present invention provides a magnetic tape device (a tape drive), method, and program for writing and reading multiple records including video data to/from a tape medium (tape, medium). More particularly, the present invention relates to reading video data saved on a tape included in a tape drive and enabling a video application to reproduce video with few interruptions.

Linear Tape File System (LTFS) is a file system that can handle data on a tape in file format. One application of the LTFS is saving video data on a tape and reading video data directly from the tape for playback. A problem associated with this technique is failure to read data due to some trouble when reading data from the tape.

Tape drives compliant to the LTO standard and having a large capacity (IBM TS series) ensure data integrity in terms of bits. There are features available for checking data integrity during reading/writing of a drive, and a mechanism has been adopted that inhibits data from being sent from the drive to a host when written data is different from read data even in one bit. When error checking on data read from the tape fails, the data is not sent to the host. An error recovery procedure (ERP) for error recovery is carried out and attempts are repeated until error checking is passed. When checking ends in a failure, then an error results.

While data is often successfully read from tape with an ERP, when an ERP occurs in the case of direct reproduction of video data, the reproduction of video data is interrupted during execution of the ERP. Also, when an error cannot be recovered by execution of an ERP, reproduction of video data stops.

For a certain type of data such as video data, usages that do not necessarily require bit-wise guarantee are conceivable. Some troubles are acceptable to users such as noise in an image transmitted via an artificial satellite that can be seen on a typical television. For certain usages, quick reproduction of the entire video data is desired rather than high-resolution reproduction of video, and for such applications, there is a greater demand for elimination of interruption or stop of an image than elimination of noise in or skips of an image. However, tape drives supported by the current LTFS do not allow for such a usage.

JP2010-225196A discloses a technique for skipping a portion of read data where an error has occurred, transferring only valid data to a host, in which the read data is then sent to an application with dummy data embedded in the skipped portion.

However, JP2010-225196A does not contemplate writing data such that the beginning of a data set is aligned with the beginning of a record and sending the entire video data without discontinuities and with minimum frame drops.

BRIEF SUMMARY

In one embodiment, a method for sequentially reading a plurality of records included in video data written in a tape medium of a magnetic tape device, characterized in that the plurality of records are given a prescribed size such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records includes receiving from the host a video special mode for reading video data; sequentially reading the records included in data sets from the tape medium into segments of a buffer; when there is no C2 error during reading of the data sets, sending the records included in the data sets; when there is a C2 error during reading of the data sets, skipping a predetermined error recovery process in accordance with the video special mode; checking whether management information (DSIT) for the data set having the C2 error is available for reading; when the DSIT is available for reading, skipping sending of the record(s) included in the data set having the C2 error to the host; for the data set having the C2 error, obtaining the number of records to be skipped (the number of skipped records) included in the data set having the C2 error based on and from the DSIT; and indicating the number to the host.

In another embodiment, a magnetic tape device configured to sequentially read a plurality of records included in video data written in a tape medium, characterized in that the plurality of records are given a prescribed size such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records. The magnetic tape device includes a read control configured to perform the foregoing method.

In yet another embodiment, a program product for sequentially reading a plurality of records included in video data written in a tape medium of a magnetic tape device, characterized in that the plurality of records are given a prescribed size such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records, the program of the program product, when executed by the magnetic tape device, causes the magnetic tape device to perform the foregoing method.

Other aspects and embodiments of the present invention will become apparent from the following detailed description, which, when taken in conjunction with the drawings, illustrate by way of example the principles of the invention.

DETAILED DESCRIPTION

Figure 1:
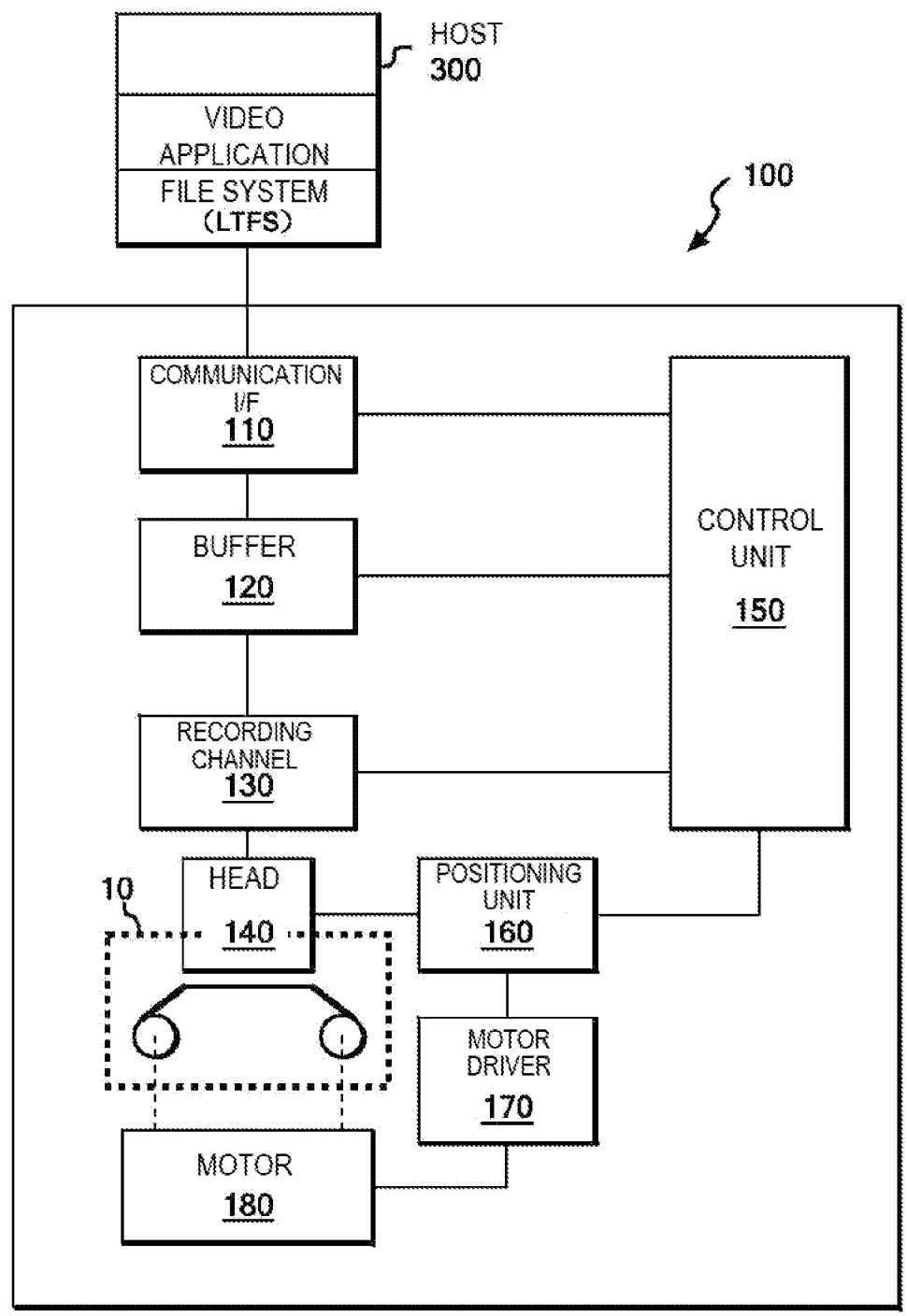
FIG. 1 shows an example hardware configuration of a tape drive (a magnetic tape device) to which an embodiment of the present invention is applied.

Various embodiments of the present invention provide a tape drive, method, and program for writing and reading multiple records including video data to/from a tape medium.

In particular, some embodiments of the present invention provide firmware for read control in a tape drive and a file system, such as LTFS, to be used at a host with a tape drive.

In one preferred embodiment, there is provided a magnetic tape device for a host to sequentially read a plurality of records included in video data written in a tape medium. The device is characterized in that the plurality of records are given a prescribed size (a fixed length) such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records. Read control by the magnetic tape device is configured to receive from the host a video special mode for reading video data, and sequentially read the records included in data sets from the tape medium into segments of a buffer. When there is no C2 error during reading of the data sets, the records included in the data sets are sent. When there is a C2 error during reading of the data sets in accordance with the video special mode, a predetermined error recovery process is skipped. The read control is further configured to check whether management information (DSIT) for the data set having the C2 error is available for reading. When the DSIT is available for reading, sending of the record(s) included in the data set having the C2 error to the host is skipped. For the data set having the C2 error, the number of records to be skipped (the number of skipped records) included in the data set having the C2 error is obtained based on and from the DSIT. The number is indicated to the host.

A file system at the host may pass dummy data of a size corresponding to the indicated number of skipped records to an application at the host. This device can give higher priority to reproduction of video with few interruptions by a video application at the host.

The device further includes, when the DSIT is available for reading, (d) setting a C2 error flag (endmarker) at the beginning of the segment of the buffer in which the data set having the C2 error has been stored and indicating the flag to the host.

The device further includes, when the DSIT is available for reading, (e) in consideration of the number of skipped records obtained, setting a next valid record number for the records and sequentially reading subsequent records from the data set following the data set having the C2 error.

The device is also characterized in that a file system at the host passes dummy data of a size corresponding to the indicated number of skipped records to an application at the host.

The device is also characterized in that the file system at the host assigns record numbers to records to be received after the skipped records based on the number of skipped records obtained.

The device further includes (f) when the DSIT is not available for reading, reporting the C2 error to the host in order to stop transfer of video data.

The device is also characterized in that skipping the predetermined error recovery process in accordance with the video special mode includes executing the error recovery process within an allowable range of delay in video data.

The device is also characterized in that the file system at the host determines the prescribed size such that an end of each segment of the buffer in which the records are stored is aligned with the end of a record, and the records are written into the tape medium such that the ends of data sets are aligned with the ends of particular ones of the records.

To attain a desired embodiment, there is provided a method for a host to sequentially read a plurality of records included in video data written in a tape medium of a magnetic tape device.

The method is characterized in that the plurality of records are given a prescribed size (a fixed length) such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records. The method includes:

receiving from the host a video special mode for reading video data;

sequentially reading the records included in data sets from the tape medium into segments of a buffer;

when there is no C2 error during reading of the data sets, sending the records included in the data sets;

when there is a C2 error during reading of the data sets, skipping a predetermined error recovery process in accordance with the video special mode;

checking whether management information (DSIT) for the data set having the C2 error is available for reading;

when the DSIT is available for reading, skipping sending of the record(s) included in the data set having the C2 error to the host; and for the data set having the C2 error, obtaining the number of records to be skipped (the number of skipped records) included in the data set having the C2 error based on and from the DSIT and indicating the number to the host.

To attain a desired embodiment of the present invention there is also provided a program, e.g., a program product, for a host to sequentially read a plurality of records included in video data written in a tape medium of a magnetic tape device. The program is characterized in that the plurality of records are given a prescribed size (a fixed length) such that one or two or more record(s) is/are included in a data set which serves as a unit of writing to the tape medium and such that a boundary of the data set is aligned with the boundary of a record, and are arranged such that a beginning of the data set coincides with the beginning of a particular one of the records. The program causes the magnetic tape device to:

(1) receive from the host a video special mode for reading video data;

(2) sequentially read the records included in data sets from the tape medium into segments of a buffer;

(3) when there is no C2 error during reading of the data sets, send the records included in the data sets;

(4) when there is a C2 error during reading of the data sets, skip a predetermined error recovery process in accordance with the video special mode;

(a) check whether management information (DSIT) for the data set having the C2 error is available for reading;

(b) when the DSIT is available for reading, skip sending of the record(s) included in the data set having the C2 error to the host; and (c) for the data set having the C2 error, obtain the number of records to be skipped (the number of skipped records) included in the data set having the C2 error based on and from the DSIT and indicate the number to the host.

The magnetic tape device according to an embodiment of the present invention outlined above can give priority to quick transfer, that is, reproduction, of video data over perfect reconstruction of data during reproduction thereof.

An embodiment of methods for writing video data from a host into a tape drive by record and reading data in a special mode will be described below.

Specifically, a writing method according to an embodiment of the invention writes data such that the beginning of a data set is aligned with the beginning of a record. A reading method according to an embodiment of the invention skips a portion of data being read where an error has occurred and transfers only valid data to the host. When data is skipped, data is sent to an application with dummy data embedded in the skipped portion. One embodiment of the present invention provides a special mode for use in sequentially reading data from a tape medium at the level of SCSI commands, for example.

FIG. 1 shows an example hardware configuration of a tape drive (a magnetic tape device) to which an embodiment of the present invention is applied.

A tape drive 100 includes a communication interface (I/F) 110, a buffer 120, a recording channel 130, a read/write head 140, a control unit 150, a positioning unit 160, a motor driver 170, and a motor 180.

The interface 110 performs communication with a host device 300 over a network. For example, the interface 110 receives from the host device 300 a write command for writing data to the medium 10. The interface 110 also receives from the host device 300 a read command for reading data from the medium 10. The interface 110 has the function of compressing data to be written and decompressing read data, enabling the medium to store substantially double the actual data volume. When data of the same type, e.g., zero data, appears consecutively, the data is written at a high compression ratio, saving the storage capacity of the medium.

The tape drive 100 writes and reads data to/from the tape cartridge 10 in units of data set (DS) which comprises records sent from the host 300. The host 300 sends write/read requests to the tape drive specifying a file for a file system and a record for a SCSI command. A DS includes a portion of a record or multiple records.

Each DS contains management information for that data set. User data is managed by record and its management information is included in a data set information table (DSIT). The DSIT includes the number of records and the number of file markers (FMs) included in the DS, as well as the cumulative number of records and cumulative number of FMs that are written in the medium from its beginning.

The buffer 120 is memory for temporarily storing data to be written to the medium 10 or data read from the medium. The buffer 120 may be dynamic random access memory (DRAM), for example. The recording channel 130 is a communication channel used for writing data stored in the buffer 120 to the medium 10 or temporarily storing data read from the medium 10 into the buffer 120.

The read/write head 140 has a data read/write element, and writes and read data to/from the medium 10. The read/write head 140 in this embodiment also has a servo reading element and reads signals from a servo track provided on the medium 10. The positioning unit 160 commands movement of the read/write head 140 in the short-side direction (or width direction) of the medium 10. The motor driver 170 drives the motor 180.

The tape drive 100 writes and reads data to/from a tape in response to a command received from the host 300. The tape drive 100 includes a buffer, a read/write channel, a head, a motor, a reel on which a tape is wound, a read/write control, a head position control system, and a motor driver. The tape drive contains a tape cartridge in a removable manner. The tape moves in the longitudinal direction as the reel rotates. The head moves in the longitudinal direction of the tape to write and read data to and from the tape. The tape cartridge 10 also includes a non-contact, non-volatile memory called cartridge memory (CM). The CM included in the tape cartridge 10 is read and written in a non-contact manner by the tape drive 100. The CM stores cartridge properties. The tape drive takes cartridge properties from the CM at the time of reading and writing so that reading/writing is optimally performed.

The control unit 150 controls the entire tape drive 100. The control unit 150 controls data write and read to and from the medium 10 in accordance with a command received at the interface. The control unit 150 also controls the positioning unit 160 responsive to a signal read from the servo track. The control unit 150 further controls the operation of the motor via the positioning unit 160 and the motor driver 170. The motor driver 170 may be directly connected with the control unit 150.

Figure 2:
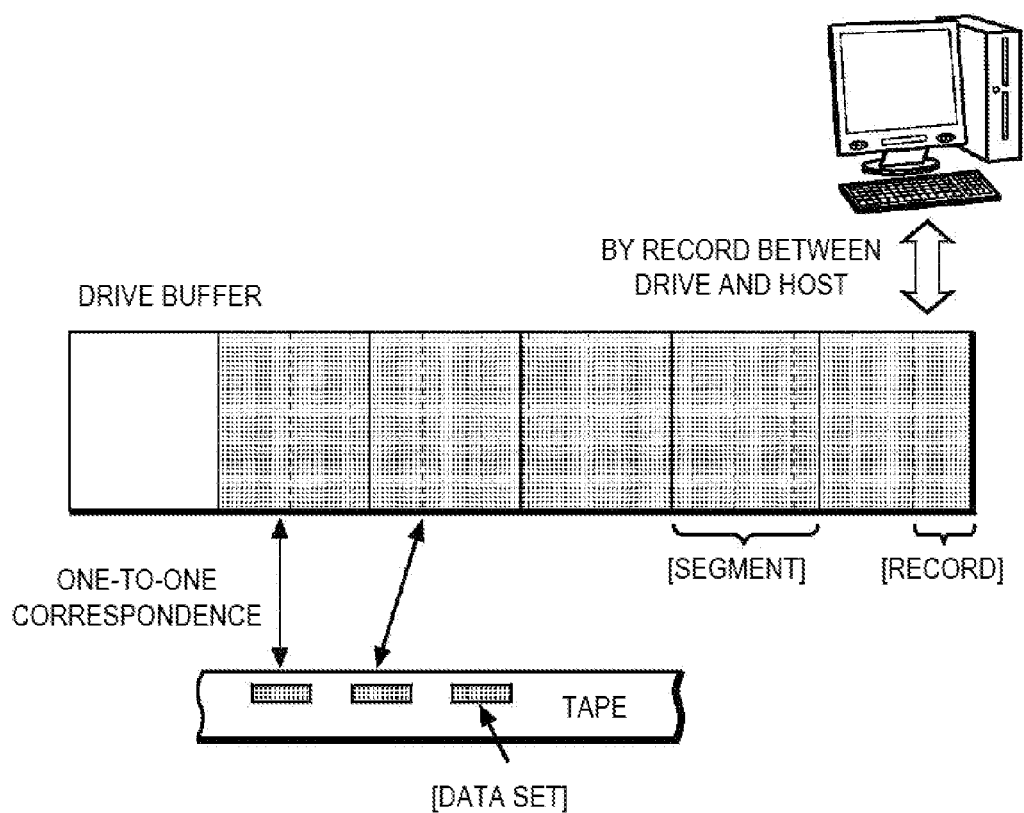
FIG. 2 shows units in which data is handled in the drive.

FIG. 2 shows units in which data is handled in the drive.

The drive buffer is divided into segments, in each of which a data set is created. For facilitating understanding of various embodiments of the present invention, data processing in the tape drive is described. In the tape drive, data is written on a tape in blocks of a fixed length called data sets. After being read from the tape, a data set is once written to the driver buffer in which it is subjected to any of various kinds of processing, and then transferred to the host. The drive buffer comprises a ring buffer made up by units called segments, where a data set on the tape has a one-to-one correspondence with a segment of the buffer. The unit of data used between the host and the drive is called a record, which may have either a fixed length or a variable length. The size of a data set is about 3 MB in the LTO fifth generation. When the record length is less than that size, more than one record will be present in a single data set. In the figure, segments are demarcated by solid lines, while records are demarcated by dotted lines.

Figure 3:
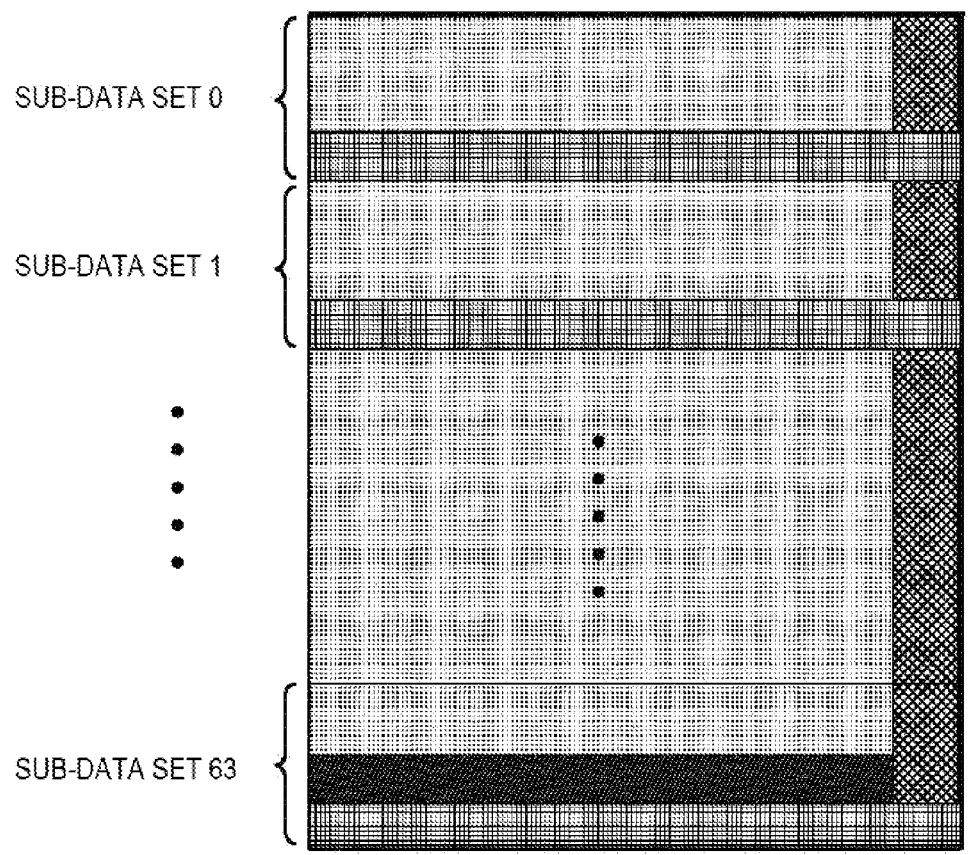
FIG. 3 is a schematic representation of a data set.
Figure 3:
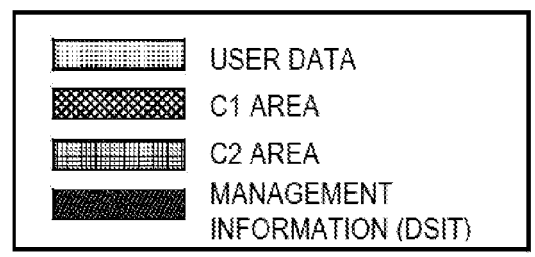

FIG. 3 is a schematic representation of a data set.

A data set is divided into 64 sub-data sets. Each sub-data set has areas for code correction called C1 and C2. The last sub-data set has an area for saving management information (DSIT) of the data set.

Figure 4:
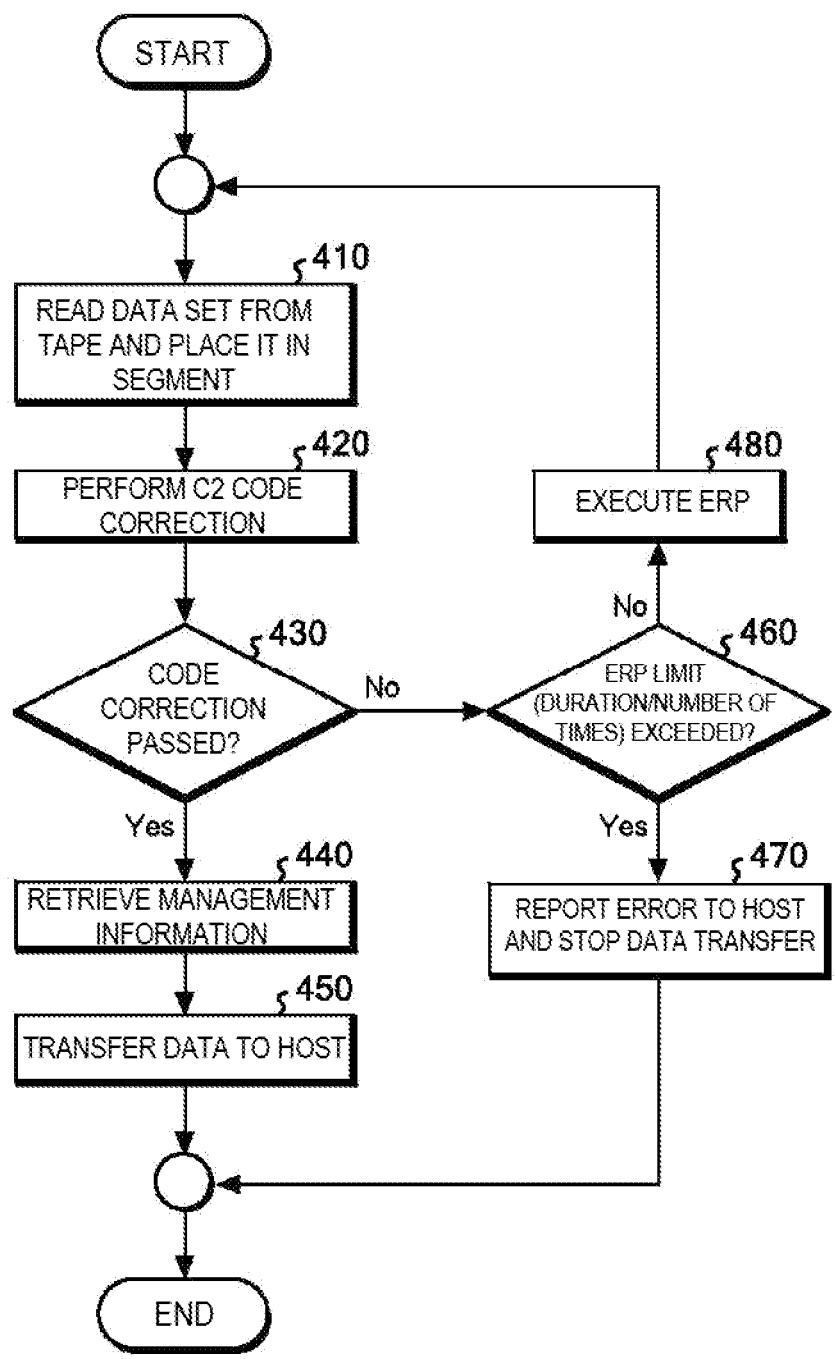
FIG. 4 is a flowchart illustrating reading of a typical data set in the tape drive.

FIG. 4 is a flowchart illustrating reading of a typical data set in the tape drive. Processing for a C2 code correction error is executed in the tape drive during reading, ensuring that complete data is read out (420, 430, 460, 480). Here, the relationship between a C2 code correction error (hereinafter "C2 error") and data reading in the tape drive is described. In the inventive reading method described below, processing associated with an ERP for reading a data set having a C2 error is not implemented or executed to a reduced extent when in the special mode for reading video data.

When a C2 error in particular occurs among checks for various errors performed on each process, the drive typically conducts an ERP and repeats read from the tape and a C2 check until a C2 check is passed. When a C2 check is passed after performance of the ERP, the data is transferred to the host; when an error results, processing is terminated (470). A C2 error can occur especially with a deteriorating tape or drive and is more frequent than other kinds of error. Conversely, video data saved on a deteriorating tape has a higher risk of not being able to be read.

Figure 5:
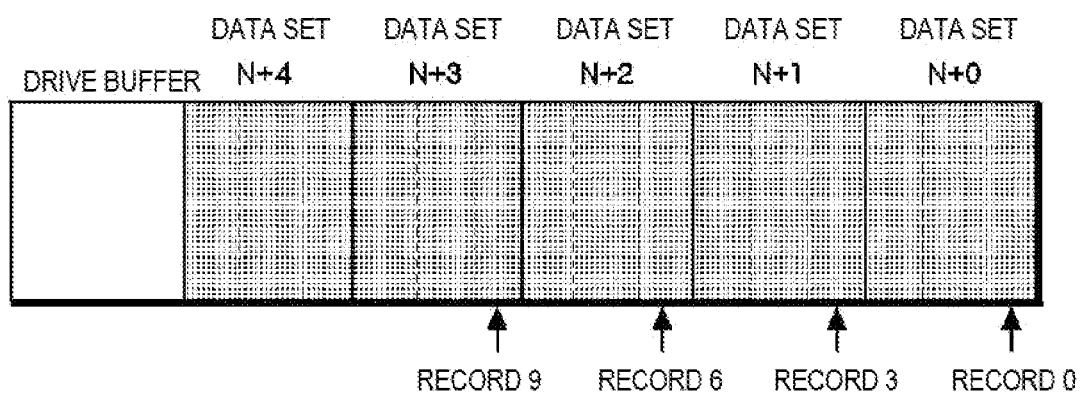
FIG. 5 shows writing of data with data set boundaries aligned with the boundaries of particular records.

FIG. 5 shows writing of data with data set boundaries aligned with boundaries of particular records. In the context of various embodiments of the present invention, records constituting video data are written in a tape medium in the following manner. Records 0, 3, 6, and 9 are written so that they start at the zero-offset position within a data set. Data contents stored in fixed-length segments of the buffer 120 are recorded onto the tape as data sets. The dotted lines denote record boundaries, while solid lines denote data set boundaries. Data is written to the drive such that the beginning of a data set is aligned with the beginning of a record.

In order to realize this way of writing in an actual tape drive, the following matters should be taken into consideration.

In decision of a record length for use in writing from the host to the drive, it is necessary to take into account additional information required for hardware and error detection information such as for CRC which are to be added to records in actual data sets.

Data should be sent in a fixed record length, because a variable length makes alignment between data set boundaries and record boundaries difficult.

Compression functions are not used, because the lengths of compressed records vary when compression functions are used, making alignment between data set boundaries and compressed data boundaries difficult.

Figure 6:
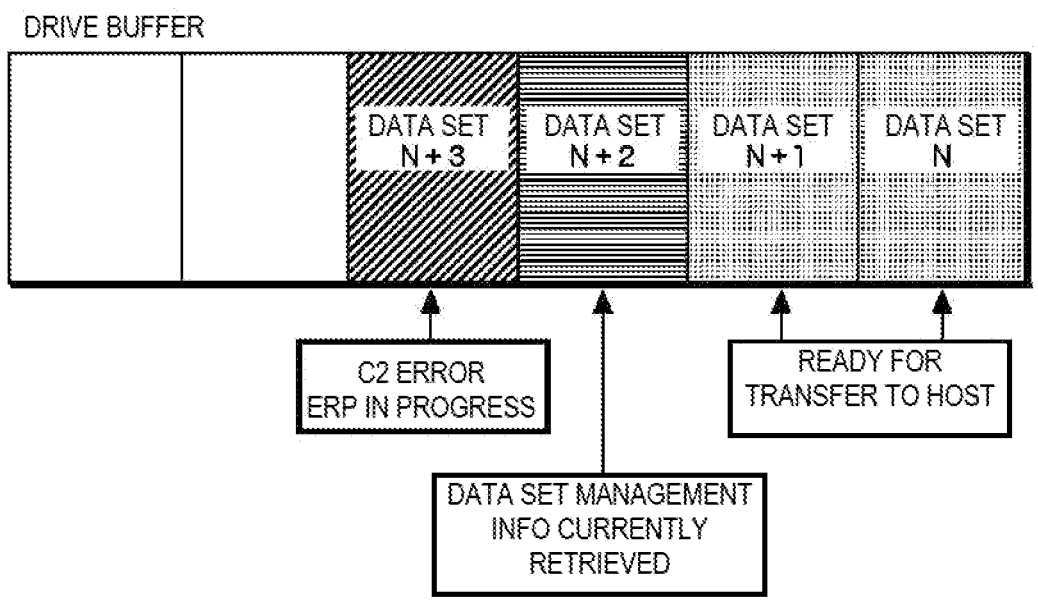
FIG. 6 illustrates a case where a C2 error occurs while data set N+3 is read.

FIG. 6 illustrates a case where a C2 error occurs while data set N+3 is read. When a C2 error occurs in part of data written as data sets as shown in FIG. 2 during read of the data, data is arranged as illustrated in FIG. 5 in a typical drive buffer. Data set N+2 for which management information (DSIT) is currently retrieved will soon become ready for transfer to the host. For the next data set N+3, an ERP is taking place due to the C2 error, so data transfer is interrupted at the point. Since an ERP is processing performed on the second time scale and can take minutes depending on the circumstances, the image is interrupted for a long time when data is being reproduced as video.

Figure 7:
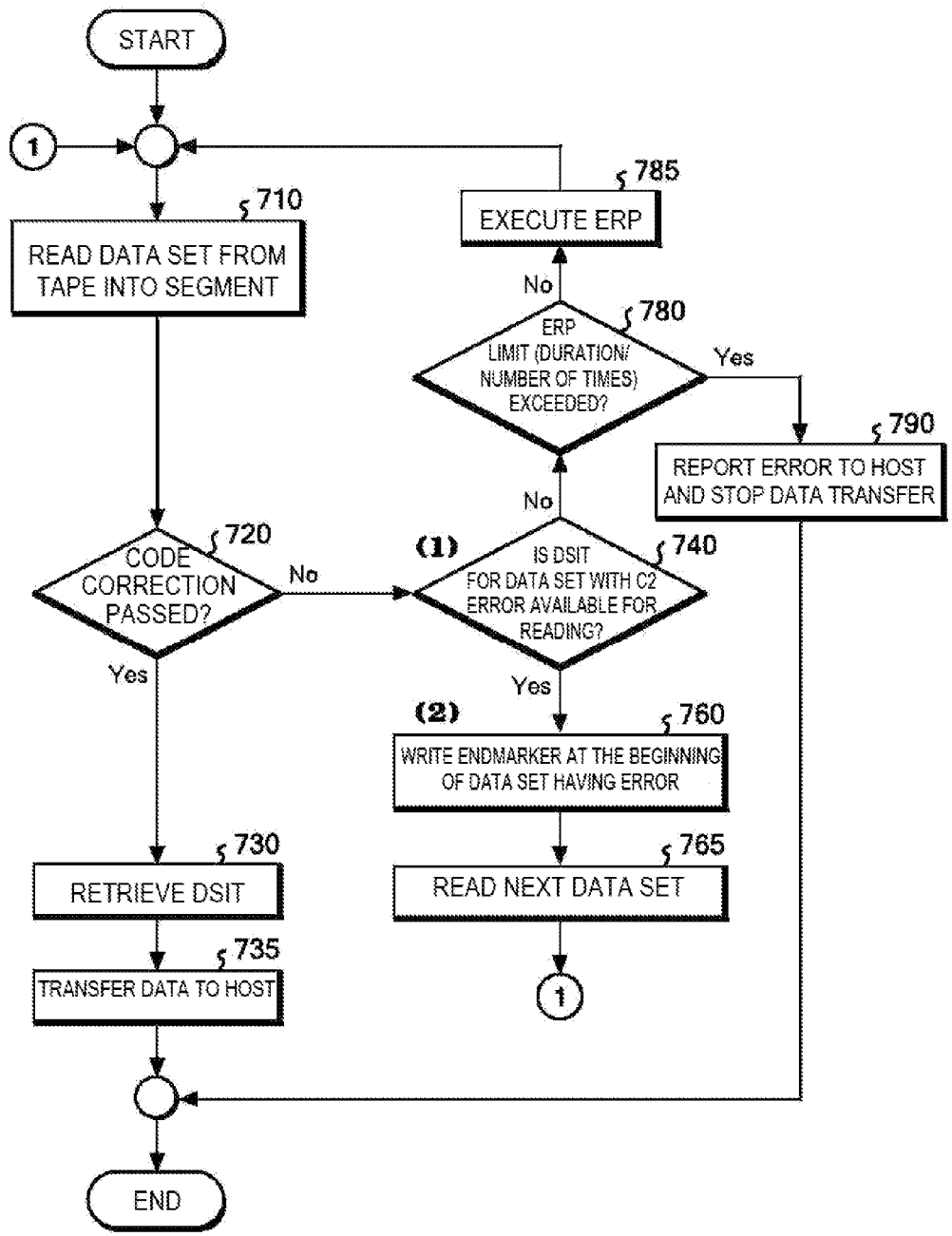
FIG. 7 is a flowchart illustrating the reading process according to an embodiment of the present invention.

FIG. 7 is a flowchart illustrating the reading process according to an embodiment of the present invention.

The inventive reading method includes two operations:
1. Skip a C2 error portion.
2. Embed dummy data in the skipped portion.

The skipping of a C2 error portion (1) is described first.

During reading, drive firmware (the control unit 150 including read control) performs step (1) (740) and step (2) (760).

In step (1), whether the DSIT can be retrieved from the data having the C2 error is determined. Since the DSIT is stored in the last sub-data set as mentioned above and C2 correction is conducted per sub-data set, DSIT information is likely to be available even when there is a C2 error in other user data areas. When the DSIT can be retrieved, the flow proceeds to the next step without making re-attempts on other user data by an ERP. Assuming that retrieval of the DSIT is the only purpose and C2 errors in portions other than the DSIT can be neglected, the possibility of the drive eventually halting due to a C2 error is 1/64 when simply calculated.

In step (2), an endmarker is then written at the beginning of the data set in which the C2 error has occurred as a C2 error flag. An endmarker is a mark for special processing to be handled by the drive, where data transfer can be temporarily interrupted at the position of an endmarker. The next point to start data transfer is specified by firmware; it is assumed to be the beginning of the next data set here. By writing an endmarker in the data set having a C2 error and resuming transfer from the beginning of the next data set, data can be transferred skipping the data with the C2 error. Since these operations are different from normal data transfer from the tape drive, a video special mode in which these operations are implemented is set in the drive beforehand from the host side, that is, the LTFS side, when these operations are necessary.

Figure 8:
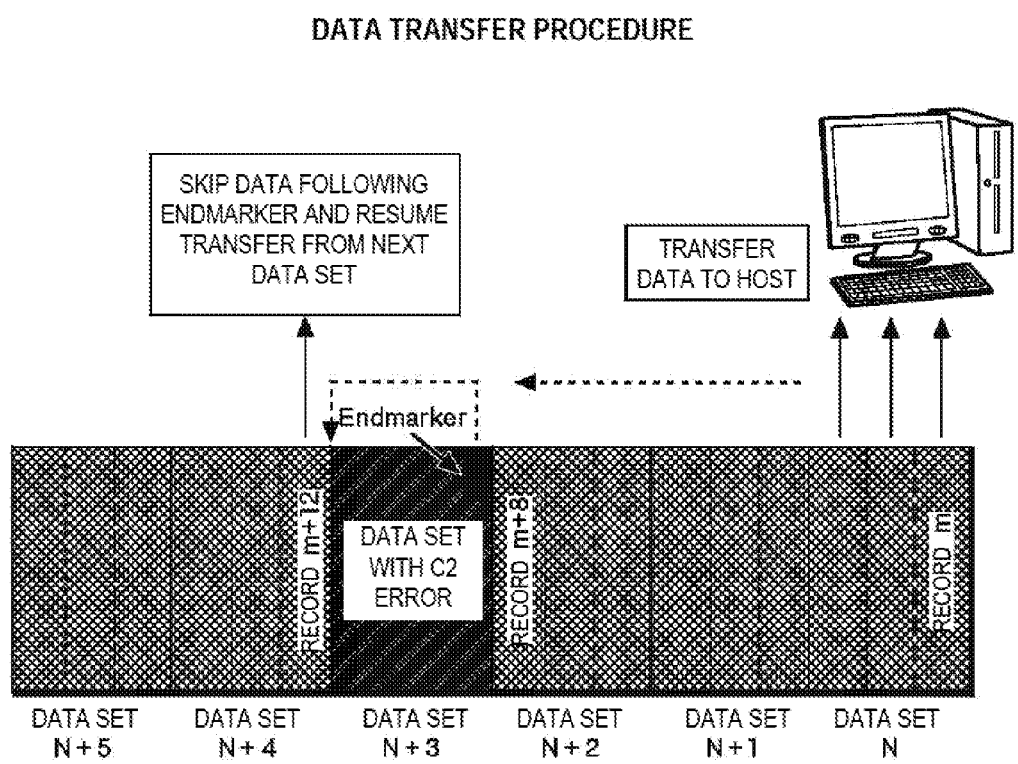
FIG. 8 shows data flow in a drive buffer when the process of FIG. 7 is performed.

FIG. 8 shows data flow in the drive buffer when the process of FIG. 7 is performed.

The drive firmware writes an endmarker at the beginning of a data set in which an error has occurred and reads data sets following the error as under normal conditions.

Here, in order to ensure that data set N+4, that is, the data set following the error in FIG. 8, is data that follows data set N+2, it is necessary to know the contents of the DSIT of the data set having the C2 error. As C2 errors can occur in sequence, the allowed maximum number of data sets with errors may be handled on the drive side by indicating a threshold to the drive or handled on the LTFS side.

During transfer of buffer data to the host, the drive temporarily interrupts data transfer at the point where the endmarker is present.

Under normal conditions, data is continuously transferred from the drive to the host by hardware. With the current hardware, however, data with a C2 error does not pass an integrity check performed when it is sent to the host, so it results in a read error and the data transfer then stops completely. Such a mechanism can avoid transfer of a data area in which an error is present to the host.

When data to be transferred to the host is skipped in response to presence of an endmarker, the point to the next data for transfer is the beginning of the first data set that has been validly read out.

By making record boundaries aligned with data set boundaries, the transfer start position can be identified only according to the condition that it is the beginning of a data set.

Figure 9:
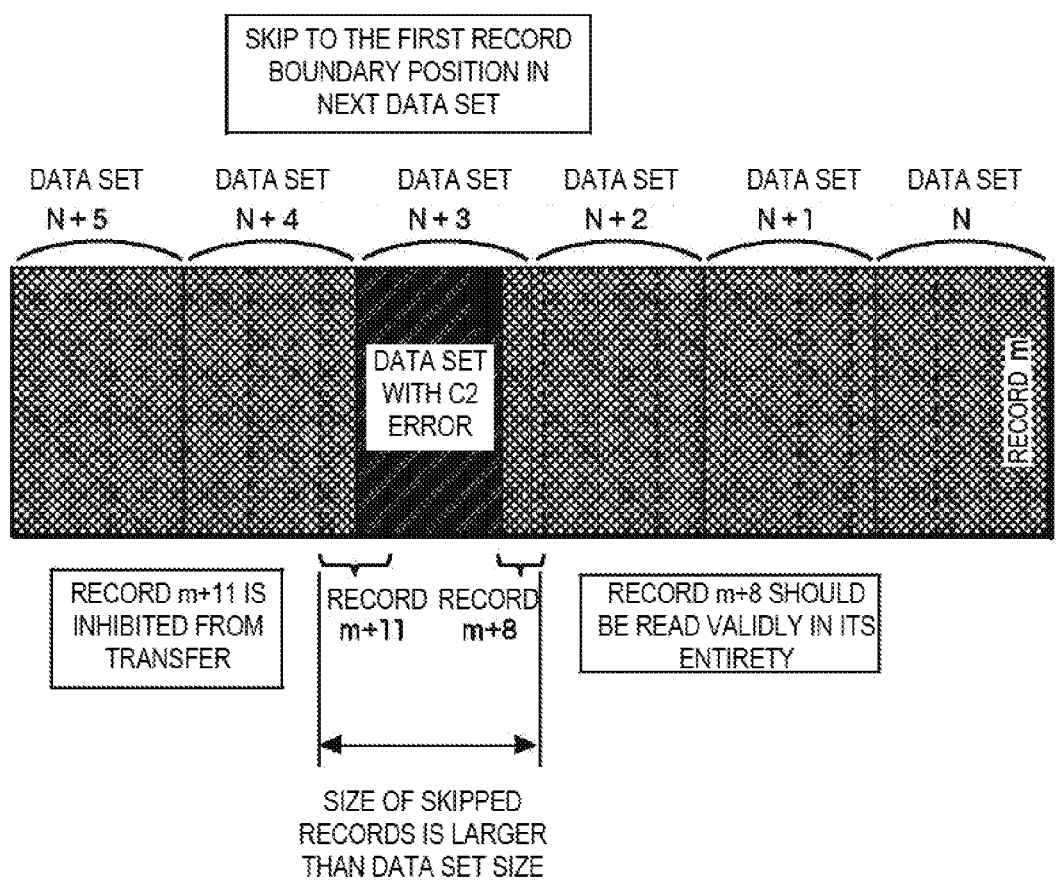
FIG. 9 schematically illustrates a case where boundary positions are not aligned.

FIG. 9 schematically illustrates a case where boundary positions are not aligned.

A disadvantage of reading multiple records which are written without data set boundaries being aligned with record boundaries is illustrated. Even when the tape drive receives variable length records from the host, it is technically possible to continue data transfer by attaching an endmarker or the like at a certain position and skipping a data set having a C2 error without aligning data set boundaries with record boundaries. Such a scheme however differs from embodiments of the present invention, in which data set boundaries are aligned with record boundaries, as follows. The beginning and end of data set N+3, which has a C2 error, are spanned by the latter part of record m+8 and the first part of record m+11, respectively. The first part of record m+8 is included in data set N+2 which has no read error, but the latter part of record m+8 is included in data set N+3 having a C2 error, so that record m+8 is regarded as an error. The latter part of record m+11 is included in data set N+4 which has no read error, while the first part of record m+11 is included in data set N+3 having a C2 error, so that record m+11 is also regarded as an error. From the DSIT, it is impossible to correctly identify the demarcation position in the record m+8 between the valid first part and the invalid latter part which is regarded as an error due to data set N+3. Similarly, it is impossible to correctly identify the demarcation position in the record m+11 between the invalid first part which is regarded as an error due to data set N+3 and the valid latter part. When two records span the beginning and end of a data set, there is a disadvantage of video data corresponding to records m+8 to m+11, which is larger than data set N+3 having a C2 error, being skipped, as will be understood from FIG. 9. This scheme does not attain the desired embodiment of giving higher priority to viewing of the entire video data while permitting minimum video data frame drops by skipping an ERP for a data set with a C2 error. For example, when fairly large records span the both ends of a data set, video data frame drops exceed an acceptable range, causing a large disadvantage.

Next, embedding of dummy data (2) in a data portion in a skipped record will be described. Skipped data need to be embedded with dummy data. Since an application that reads data via an LTFS specifies the length of data to be read, it is necessary to pass data to the application with the data length maintained also with skipped data. Due to the necessity to prevent loss of a skipped and omitted data portion, the LTFS returns data to the application with dummy data embedded in the skipped data portion. Although it is technically feasible to embed dummy data at the drive and pass the whole data including the dummy data to the LTFS, embedding by the LTFS is more realistic in terms of implementation.

Figure 10:
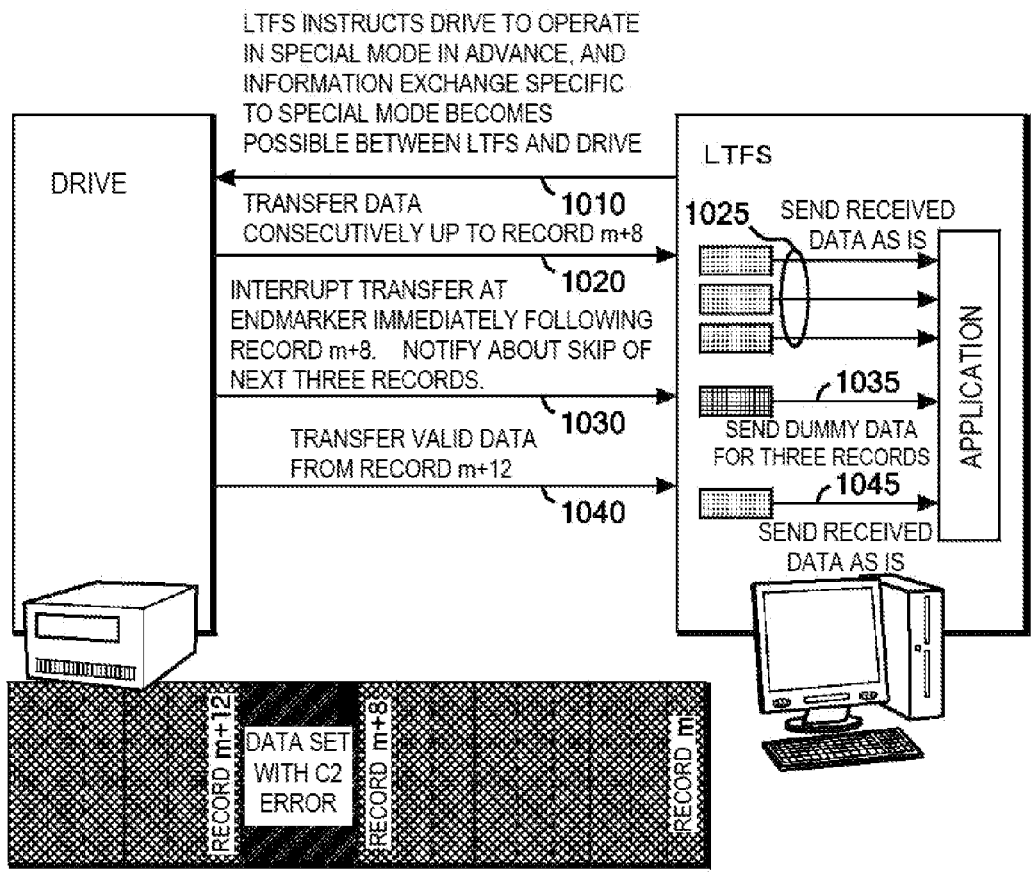
FIG. 10 illustrates a procedure of data transfer between the drive and the host, and between an LTFS and a video application at the host.

FIG. 10 illustrates a procedure of data transfer between the drive and the host, and between the LTFS and the video application at the host.

The host issues a request for reading video data records in the special mode (1010). The special mode requires the tape drive (the drive) to perform actions such as skipping a read error in a given ERP. The drive transfers consecutive data up to record m+8, which is included in validly read data sets, to the host (1020). The LTFS sends the consecutive data up to record m+8 it received to the video application (1025). An endmarker is added to the beginning of a segment in the buffer corresponding to the data set having the C2 error. The drive detects the presence of the endmarker at the beginning of the segment and skips the data set having the C2 error (1030). Although not explicitly described, step (1030) assumes that the DSIT has been retrieved for the data set having the C2 error when in the special mode according to an embodiment of the invention. The DSIT keeps the number of records included in data sets that are not skipped. The drive notifies the host of the number of records obtained from the DSIT. From the number of records, the LTFS at the host can determine the record numbers and the number of records that were skipped. The LTFS generates dummy data corresponding to the skipped records and sends it to the video application (1035).

The drive sends the following consecutive data from the record m+12 which is included in valid data sets to the host (1040). At the host, the LTFS sends the following consecutive data from the record m+12 to the video application (1045).

Figure 11:
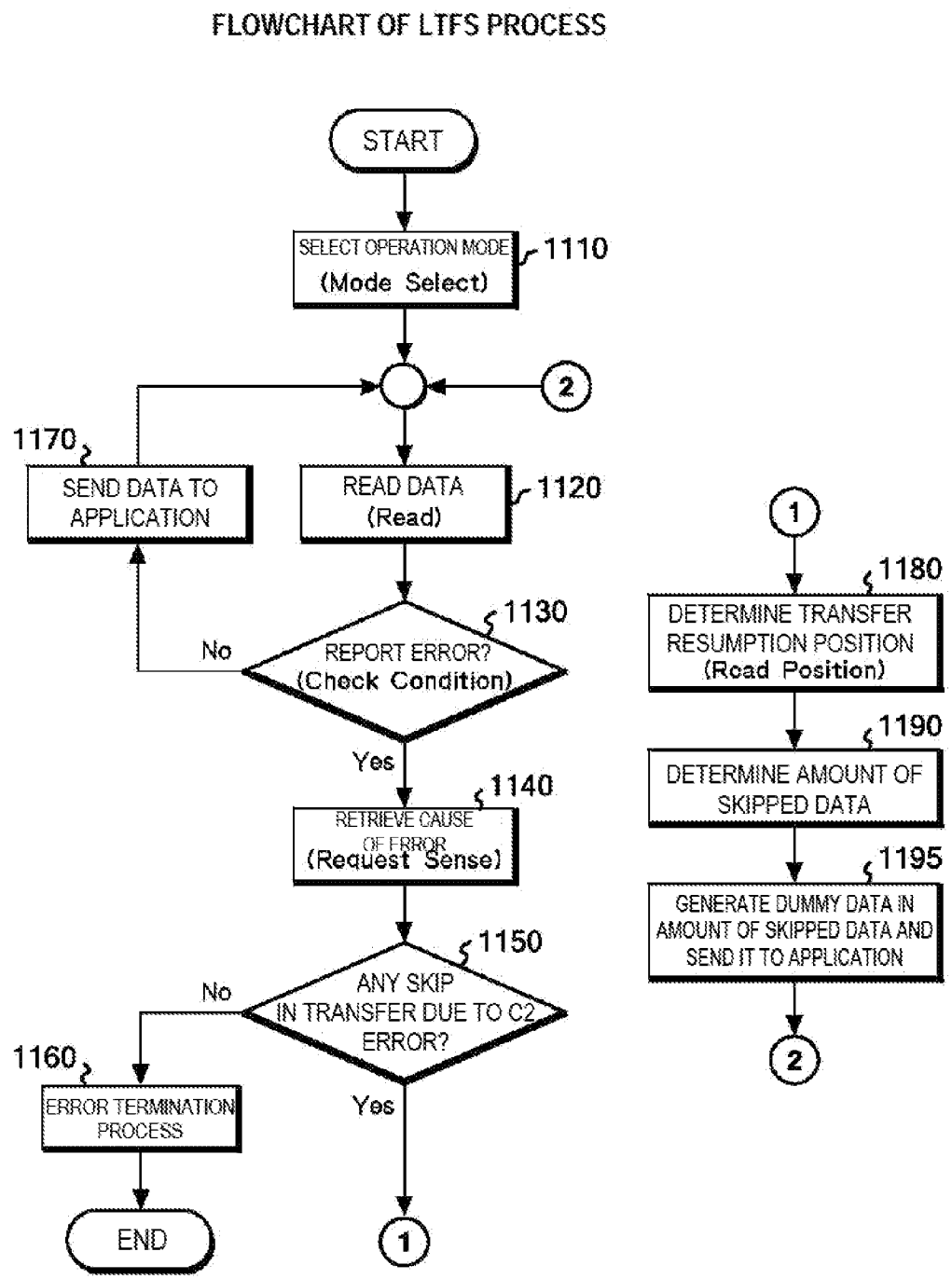
FIG. 11 is a detailed flowchart illustrating the inventive reading method when the procedure of FIG. 10 is seen from the LTFS side.

FIG. 11 is a detailed flowchart illustrating the inventive reading method when the above described procedure is seen from the LTFS end. A series of steps 1110, 1120, 1130, 1140, and 1180 represent processing between the drive and the host. Steps 1170 and 1195 represent processing between the LTFS and the application at the host.

The inventive reading method is assessed for a case where it is applied to a typical video application. A bit rate of about 25 Mbps of a hi-vision video camera is equivalent to 3.125 MB/s. As a data set compliant to LTO5 is about 3 MB, skipping of one data set means an interruption of about one second. Given the fact that conventional techniques lead to an interruption of several seconds to minutes as a result of an ERP or the like or even end in an abort of transfer, replacement of frame drops for about one second with dummy data is acceptable in terms of user experience.

As described, the tape drive according to one embodiment reads video data stored on a tape and ensures that a video application at the host reproduces video with few interruptions. Although the inventive reading method does not implement hardware modifications, some modification to hardware and the like enables an implementation that can be handled without making record and data set boundaries aligned with each other. Alignment of record and data set boundaries is necessary for determining the point at which to start data transfer after skipping data. Only when the DSIT can be read from a data set having a C2 error, can the point to start transfer of the next data set can be identified. Even an existing tape drive can implement processing only when DSIT information can be read. For reading the DSIT as reliably as possible, an arrangement such as providing the DSIT at multiple positions increases the possibility that it can be read, in which case hardware modification is required.

While the present invention has been described with respect to an embodiment thereof, the scope of the invention is not limited to the embodiment. It will be apparent to those skilled in the art that various modifications may be made or alternative embodiments may be employed without departing from the spirit and scope of the invention.

What is claimed is:

1. A magnetic tape device configured to sequentially read a plurality of records included in video data written in a tape medium, characterized in that the plurality of records are given a prescribed size such that at least one record is included in a data set which serves as a unit of writing to the tape medium and such that a boundary of the data set is aligned with a boundary of a record, and are arranged such that a beginning of the data set coincides with the beginning of a particular one of the records, the magnetic tape device comprising:

a read control configured to:

receive from a host a video special mode for reading video data;

sequentially read the records included in data sets from the tape medium into segments of a buffer;

when there is no C2 error during reading of the data sets, send the records included in the data sets;

when there is a C2 error during reading of the data sets, skip a predetermined error recovery process in accordance with the video special mode;

check whether management information (DSIT) for the data set having the C2 error is available for reading;

when the DSIT is available for reading, skip sending of the record(s) included in the data set having the C2 error to the host; and for the data set having the C2 error, obtain the number of records to be skipped included in the data set having the C2 error based on and from the DSIT and indicate the number to the host.

2. The magnetic tape device according to claim 1, wherein the read control is further configured to, when the DSIT is available for reading, set a C2 error flag at the beginning of the segment of the buffer in which the data set having the C2 error has been stored and indicating the flag to the host.

3. The magnetic tape device according to claim 2, wherein the read control is further configured to, when the DSIT is available for reading, in consideration of the number of skipped records obtained, set a next valid record number for the records and sequentially read subsequent records from the data set following the data set having the C2 error.

4. The magnetic tape device according to claim 1, wherein a file system at the host passes dummy data of a size corresponding to the indicated number of skipped records to an application at the host.

5. The magnetic tape device according to claim 1, wherein a file system at the host assigns record numbers to records to be received after the skipped records based on the obtained number of skipped records.

6. The magnetic tape device according to claim 1, wherein the read control is further configured to, when the DSIT is not available for reading, report the C2 error to the host in order to stop transfer of video data.

7. The magnetic tape device according to claim 1, wherein skipping the predetermined error recovery process in accordance with the video special mode includes executing the error recovery process within an allowable range of delay in video data.

8. The magnetic tape device according to claim 1, wherein a file system at the host determines the prescribed size such that an end of each segment of the buffer in which the records are stored is aligned with the end of a record, and the records are written into the tape medium such that the ends of data sets are aligned with the ends of particular ones of the records.

9. A method to sequentially read a plurality of records included in video data written in a tape medium of a magnetic tape device, characterized in that the plurality of records are given a prescribed size such that at least one record is included in a data set which serves as a unit of writing to the tape medium and such that a boundary of the data set is aligned with a boundary of a record, and are arranged such that a beginning of the data set coincides with the beginning of a particular one of the records, the method comprising:
receiving from a host a video special mode for reading video data;
sequentially reading the records included in data sets from the tape medium into segments of a buffer;
when there is no C2 error during reading of the data sets, sending the records included in the data sets;
when there is a C2 error during reading of the data sets, skipping a predetermined error recovery process in accordance with the video special mode;
checking whether management information (DSIT) for the data set having the C2 error is available for reading;
when the DSIT is available for reading, skipping sending of the record(s) included in the data set having the C2 error to the host;
for the data set having the C2 error, obtaining the number of records to be skipped included in the data set having the C2 error based on and from the DSIT; and
indicating the number to the host.

10. The method according to claim 9, further comprising, when the DSIT is available for reading, setting a C2 error flag at the beginning of the segment of the buffer in which the data set having the C2 error has been stored and indicating the flag to the host.

11. The method according to claim 10, further comprising, when the DSIT is available for reading, in consideration of the number of skipped records obtained, setting a next valid record number for the records and sequentially reading subsequent records from the data set following the data set having the C2 error.

12. The method according to claim 9, wherein a file system at the host passes dummy data of a size corresponding to the indicated number of skipped records to an application at the host.

13. The method according to claim 9, wherein a file system at the host assigns record numbers to records to be received after the skipped records based on the obtained number of skipped records.

14. The method according to claim 9, further comprising, when the DSIT is not available for reading, reporting the C2 error to the host in order to stop transfer of video data.

15. The method according to claim 9, wherein skipping the predetermined error recovery process in accordance with the video special mode includes executing the error recovery process within an allowable range of delay in video data.

16. The method according to claim 9, wherein a file system at the host determines the prescribed size such that an end of each segment of the buffer in which the records are stored is aligned with the end of a record, and the records are written into the tape medium such that the ends of data sets are aligned with the ends of particular ones of the records.

17. A non-transitory program product for sequentially reading a plurality of records included in video data written in a tape medium of a magnetic tape device, characterized in that the plurality of records are given a prescribed size such that at least one record is included in a data set which serves as a unit of writing to the tape medium and such that a boundary of the data set is aligned with a boundary of a record, and are arranged such that a beginning of the data set coincides with the beginning of a particular one of the records, the program of the program product, when executed by the magnetic tape device, causes the magnetic tape device to:
receive from a host a video special mode for reading video data;
sequentially read the records included in data sets from the tape medium into segments of a buffer;
when there is no C2 error during reading of the data sets, send the records included in the data sets;
when there is a C2 error during reading of the data sets, skip a predetermined error recovery process in accordance with the video special mode;
check whether management information (DSIT) for the data set having the C2 error is available for reading;
when the DSIT is available for reading, skip sending of the record(s) included in the data set having the C2 error to the host; and
for the data set having the C2 error, obtain the number of records to be skipped included in the data set having the C2 error based on and from the DSIT and indicate the number to the host.

18. The program product according to claim 17, wherein the program of the program product, when executed by the magnetic tape device, causes the magnetic tape device to, when the DSIT is available for reading, set a C2 error flag at the beginning of the segment of the buffer in which the data set having the C2 error has been stored and indicating the flag to the host.

19. The program product according to claim 17, wherein the program of the program product, when executed by the magnetic tape device, causes the magnetic tape device to, when the DSIT is not available for reading, report the C2 error to the host in order to stop transfer of video data.

20. The program product according to claim 17, wherein skipping the predetermined error recovery process in accordance with the video special mode includes executing the error recovery process within an allowable range of delay in video data.

* * * * *